United States Patent
Park et al.

(10) Patent No.: US 8,058,959 B2
(45) Date of Patent: Nov. 15, 2011

(54) TRANSFORMER AND TRANSFORMER ASSEMBLY

(75) Inventors: Geun Young Park, Gyunggi-do (KR); Sang Joon Seo, Gyunggi-do (KR); Jae Gen Eom, Gyunggi-do (KR); Chang Yong Kwon, Chungcheongnam-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/640,231

(22) Filed: Dec. 17, 2009

(65) Prior Publication Data
US 2011/0084789 A1    Apr. 14, 2011

(30) Foreign Application Priority Data
Oct. 9, 2009   (KR) .................. 10-2009-0095908

(51) Int. Cl.
*H01F 27/06* (2006.01)
*H01F 27/28* (2006.01)
*H01F 27/29* (2006.01)
*H01F 27/30* (2006.01)
*H01F 5/00* (2006.01)

(52) U.S. Cl. .......... 336/65; 336/182; 336/192; 336/198; 336/200

(58) Field of Classification Search ............... 336/192, 336/198, 182, 65, 200
See application file for complete search history.

(56) References Cited

U.S. PATENT DOCUMENTS
6,727,793 B2 *   4/2004   Piechnick ............. 336/198
6,876,555 B2 *   4/2005   Matsumoto et al. .......... 361/782
2007/0126542 A1 *   6/2007   He et al. ............. 336/83

FOREIGN PATENT DOCUMENTS
JP    61047612 A  *  3/1986
KR   1020050060114     6/2005
* cited by examiner

*Primary Examiner* — Anh Mai
*Assistant Examiner* — Ronald Hinson
(74) *Attorney, Agent, or Firm* — Lowe, Hauptman, Ham & Berner, LLP

(57) ABSTRACT

A transformer includes: a bobbin on which a coil is wound; a core coupled with the bobbin to provide a magnetic flux and installed on the PCB in a penetrating manner; and a base plate electrically connected to the coil and having a lead frame connected to the PCB, wherein the lead frame is formed such that the base plate is separated from an upper surface of the PCB.

12 Claims, 5 Drawing Sheets

TRANSFORMER AND TRANSFORMER ASSEMBLY

CROSS-REFERENCE TO RELATED APPLICATIONS

This application claims the priority of Korean Patent Application No. 10-2009-0095908 filed on Oct. 9, 2009 in the Korean Intellectual Property Office, the disclosure of which is incorporated herein by reference.

BACKGROUND OF THE INVENTION

1. Field of the Invention

The present invention relates to a transformer and, more particularly, to a transformer assembled in a reverse form (i.e., in a reversed state) on a printed circuit board (PCB) to thereby reduce the height of the transformer mounted the PCB, and a transformer assembly.

2. Description of the Related Art

A transformer, a device for changing an AC voltage and a current value by using the phenomenon of electromagnetic induction, is one of the requisite components for electronic products. The transformer is fabricated by winding a coil on and around a large magnetic core. As for the coil, a primary coil is connected to an input circuit whose voltage is to be changed, and a secondary coil is connected to an output circuit in which the changed voltage is used.

Recently, research into a technique for reducing the overall size of electronic products is actively ongoing due to consumer demand, especially in the area of flat panel displays (FPDs), such as liquid crystal displays (LCDs), plasma display panels (PDPs), and organic light emitting diodes (OLEDs).

In general, in a transformer, a coil is wound on a bobbin coupled to a core, and the core is disposed on a base plate having a lead frame to which the coil is electrically connected.

The lead frame is formed by being bent in a direction perpendicular to that in which the core is mounted on the base plate, and mounted on the PCB.

When the transformer is installed at a normal position on the PCB, the height of a top face of the transformer is equal to the height of the transformer on the upper surface of the PCB.

This type of transformer cannot be further reduced in height, making it impossible to obtain a thinner flat panel display.

SUMMARY OF THE INVENTION

An aspect of the present invention provides a transformer assembled in a reverse form on a core through hole formed on a printed circuit board (PCB), thus being mounted on the PCB, and a transformer assembly.

According to an aspect of the present invention, there is provided a transformer including: a bobbin on which a coil is wound; a core coupled with the bobbin to provide a magnetic flux and installed on the PCB in a penetrating manner; and a base plate electrically connected to the coil and having a lead frame connected to the PCB, wherein the lead frame is formed such that the base plate is separated from an upper surface of the PCB.

A lower surface of the base plate may be separated from the upper surface of the PCB by a space equal to the distance by which the core is exposed from the upper surface of the PCB.

An insulating member may be provided in the space between the PCB and the base plate and may be fastened to an insulating member insertion hole formed on the PCB.

The insulating member may be an injection-molded product supporting the base plate and installed to be adjacent to the lead frame.

The base plate may include a support pin supporting the space between the base plate and the PCB, and the support pin is fastened to a support pin hole formed on the PCB.

The base plate may include a boss extending to support the space between the base plate and the PCB, and the boss may be fastened to a boss hole formed on the PCB.

According to another aspect of the present invention, there is provided a transformer assembly including: a transformer including a core coupled to a bobbin on which coil is wound and a base plate supporting the core; and a printed circuit board (PCB) having a through hole which the core penetrates, a portion of the core being disposed within the through hole, wherein the base plate includes a lead frame allowing the transformer to be mounted in a reverse form on the PCB so as to provide a space between the base plate and the PCB.

The lead frame may be bent to extend in a direction in which the core is mounted.

An insulating member may be provided in a space between the base plate and the PCB, and an insulating member insertion hole may be formed on the PCB allowing the insulating member to be inserted therein.

The insulating member may be an injection-molded product supporting the base plate and installed to be adjacent to the lead frame.

The base plate may include a support pin supporting the space between the base plate and the PCB, and a support pin hole into which the support pin is fastened may be formed on the PCB.

The base plate may include a boss extending to support the space between the base plate and the PCB, and a boss hole into which the boss is fastened may be formed on the PCB.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
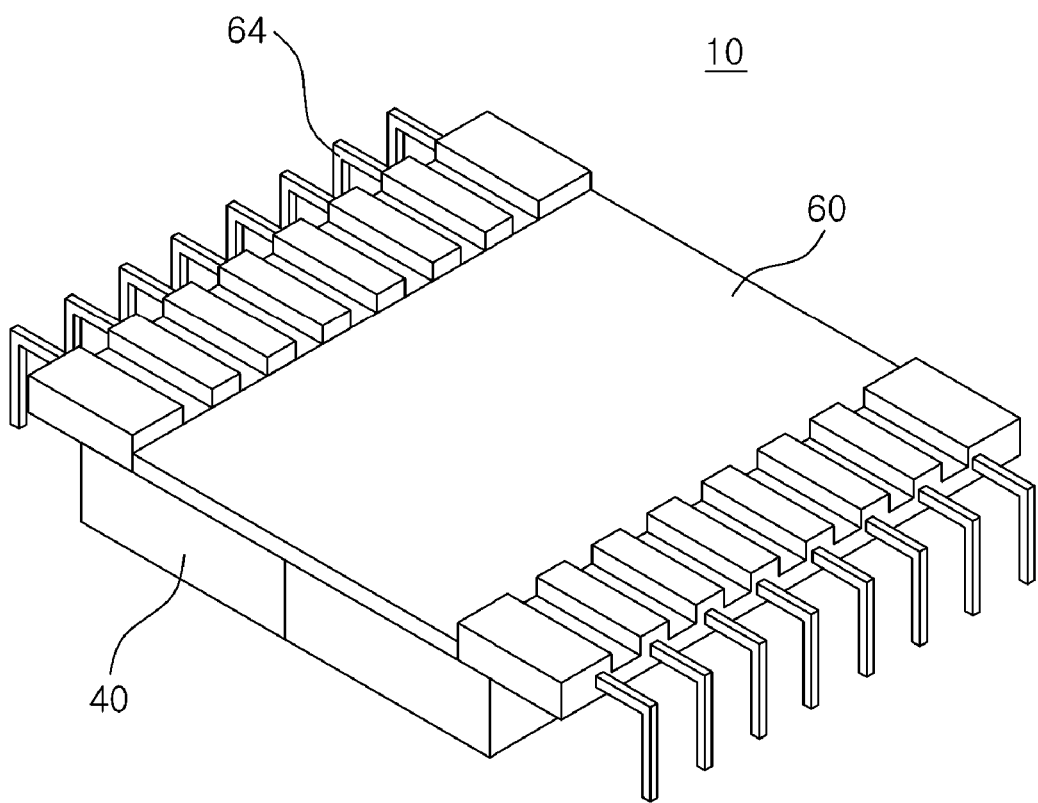
FIG. 1 is a schematic perspective view of a transformer according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, shapes and dimensions may be exaggerated for clarity, and the same reference numerals will be used throughout to designate the same or like components.

Figure 2:
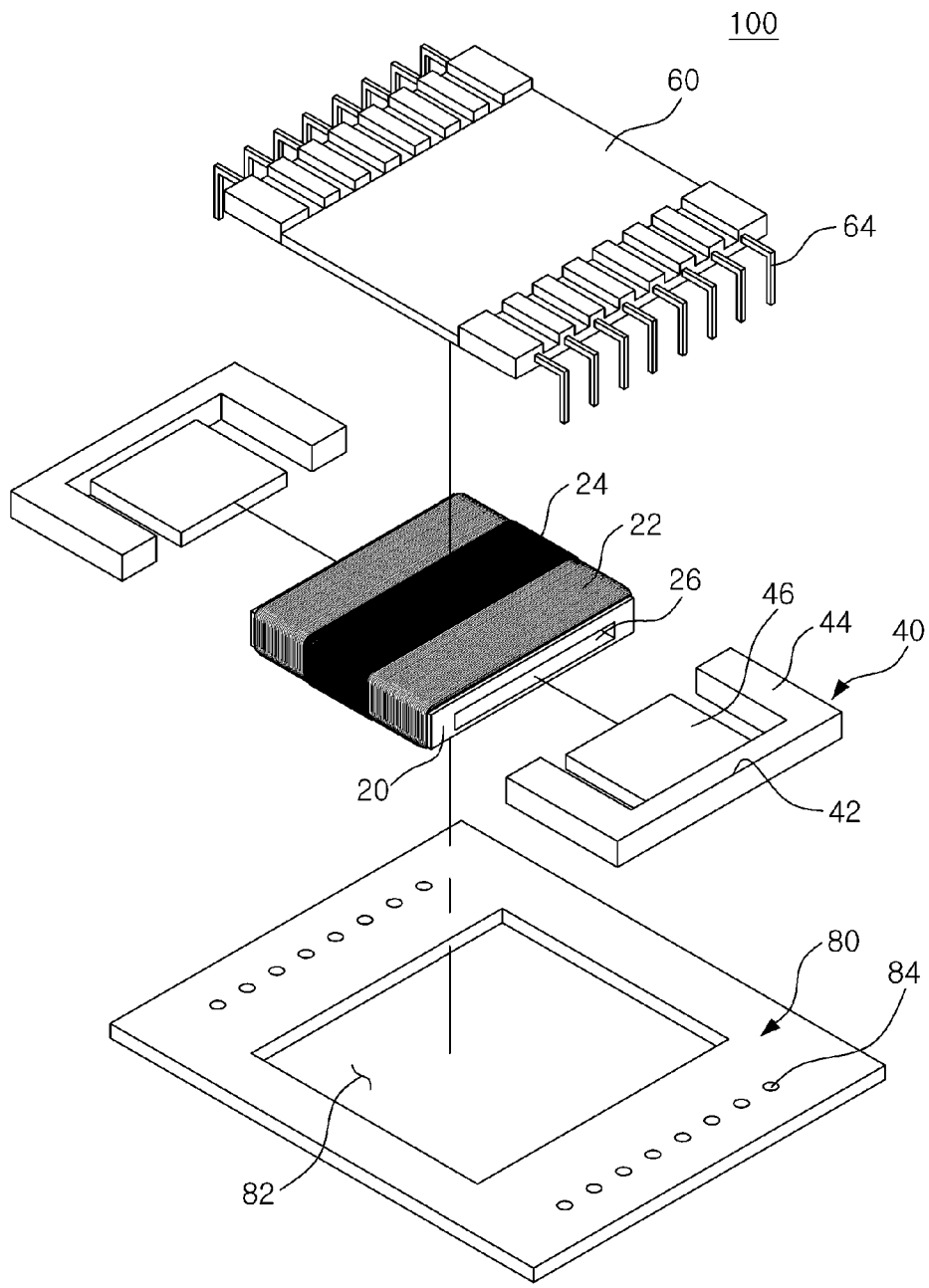
FIG. 2 is an exploded perspective view of a transformer assembly formed as the transformer is coupled to a printed circuit board (PCB) according to an exemplary embodiment of the present invention.

FIG. 1 is a schematic perspective view of a transformer according to an exemplary embodiment of the present invention, and FIG. 2 is an exploded perspective view of a transformer assembly formed as the transformer is coupled to a printed circuit board (PCB) according to an exemplary embodiment of the present invention.

Figure 3:
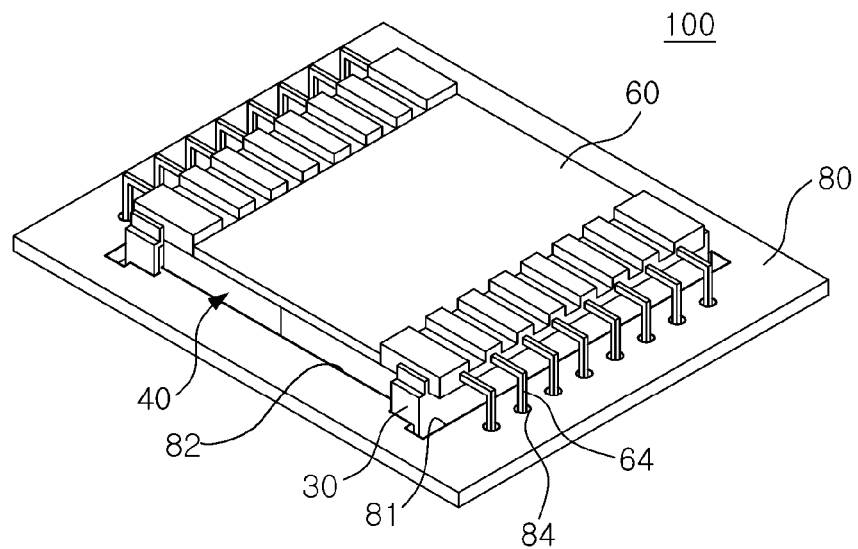
FIG. 3 is a schematic perspective view of a transformer assembly according to a first exemplary embodiment of the present invention.

With reference to FIGS. 1 to 3, a transformer assembly 100 according to an exemplary embodiment of the present invention includes a transformer 10, and a PCB 80 on which the transformer 10 is mounted.

The transformer 10 applied to the transformer assembly 100 can have all the technical features of the transformer 10 described hereafter.

The transformer 10 may include a bobbin 20, a core 40, and a base plate.

The core 40 may be coupled with the bobbin 20 on which coils 22 and 24 are wound. The bobbin 20 may have a rectangular section and include a middle foot portion insertion hole 26 in which a middle foot portion 44 can be inserted. A primary coil 22 may be wound on an outer circumferential surface of the bobbin 20, and a secondary coil 24 may be wound on an outer circumferential surface of the primary coil 22.

The core 40, a sintered body fabricated by sintering powder of a ferrite material, may have an 'E' shape. Namely, the core 40 may have outer foot portions 44 at edges of a core base 44, and a middle foot portion 46 may be formed between the outer foot portions 44.

Here, in the present exemplary embodiment, the core 40 has the 'E' shape; however, it is not limited thereto, and the core 40 may have any other shape as deemed necessary.

The core 40 is coupled with the bobbin 20 to provide magnetic flux, and the combination thereof may be installed on a printed circuit board (PCB) 80 in a penetrating manner.

Meanwhile, the wound shape and arrangement of the primary and secondary coils 22 and 24 may be easily changed according to the preference of a skilled person in the art.

The base plate 60 may include a lead frame 64 electrically connected with the coil 40 so as to be connected with the PCB 80.

The core 40 and the coils 22 and 24 may be fixed on the base plate 60 by an adhesive or varnish impregnation (or varnish dropping and infiltrating.

Meanwhile, the transformer 10 may be mounted in a reversed state on the PCB 80.

Here, the lead frame 64 may be formed such that the base plate 60 is separated from an upper surface of the PCB 80. Namely, a through hole 82 allowing the core 40 to pass therethrough is formed on the PCB 80, and a portion of the core 40 may be disposed within the through hole 82.

Accordingly, a lower surface of the base plate 60 may be separated from the upper surface of the PCB 80 by a space equal to the distance by which the core 40 is exposed (i.e., protruded) from the upper surface of the PCB 80.

In order to fix the transformer 10 in a reversed form on the PCB 80, the base plate 60 may have the lead frame 64 allowing the base plate 60 and the PCB 80 to have a space therebetween.

The lead frame 64 may be bent to extend in the direction in which the core 40 is mounted, and may be inserted into lead frame insertion holes 84 formed on the PCB 80 so as to be mounted.

When the transformer 10 is configured in the reversed shape to allow a portion of the core 40 to be inserted into the through hole 82 of the PCB 80, the base plate 60 can be separated by a certain amount of space without being in contact with the PCB 80.

Also, because the core 40 is disposed below the through hole 82, the height of the transformer 10 from the PCB 80 can be remarkably reduced. As a result, compared with a flat panel display in which the transformer is installed in a normal position (i.e., normal state, or normal shape) on the PCB 80, the thickness of the flat panel display with the transformer 10 in the reversed form can be reduced.

Exemplary embodiments for firmly coupling the transformer 10 on the PCB 80 will now be described.

Figure 4:
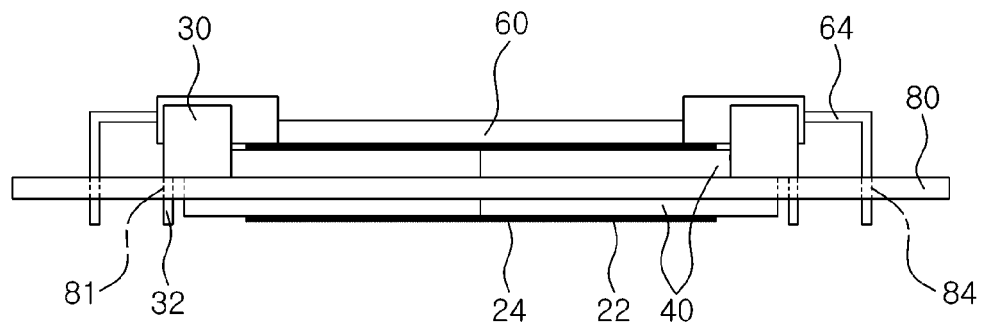
FIG. 4 is a side view of the transformer assembly according to the first exemplary embodiment of the present invention.

FIG. 3 is a schematic perspective view of a transformer assembly according to a first exemplary embodiment of the present invention, and FIG. 4 is a side view of the transformer assembly according to the first exemplary embodiment of the present invention.

With reference to FIGS. 3 and 4, in a transformer assembly 100 according to a first exemplary embodiment of the present invention, an insulating member 30 may be provided in the space between the PCB 80 and the base plate 60.

The insulating member 30, an injection-molded product, a member separate from the base plate 60 may be fastened to an insulating member insertion hole 81 formed on the PCB 80.

The insulating member 30 may support the base plate 60 and may be installed to be adjacent to the lead frame 64.

Because the insulating member 30 is provided in the space between the PCB 80 and the base plate 60, the transformer 10 can be not only insulated but also stably supported on the PCB 80.

Figure 5:
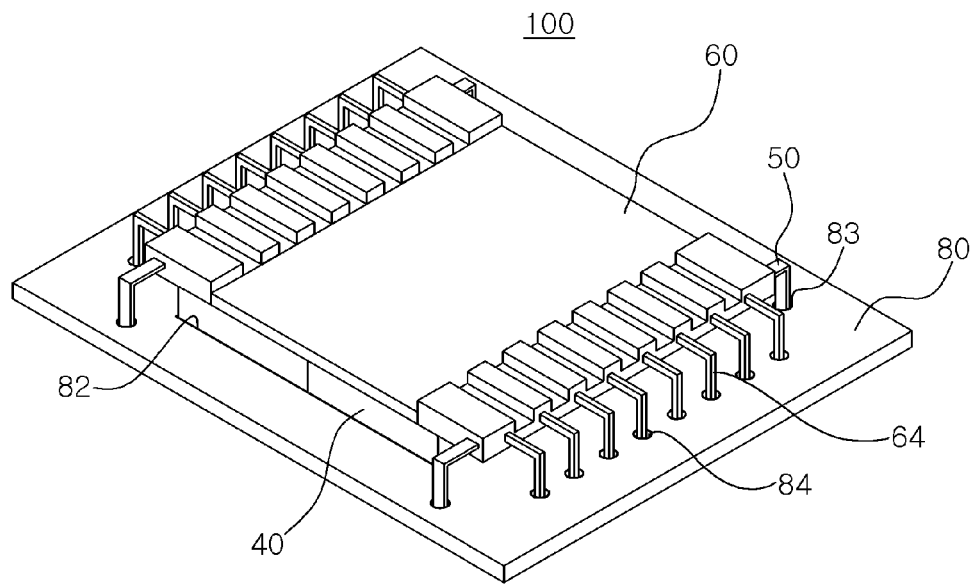
FIG. 5 is a schematic perspective view of a transformer assembly according to a second exemplary embodiment of the present invention.
Figure 6:
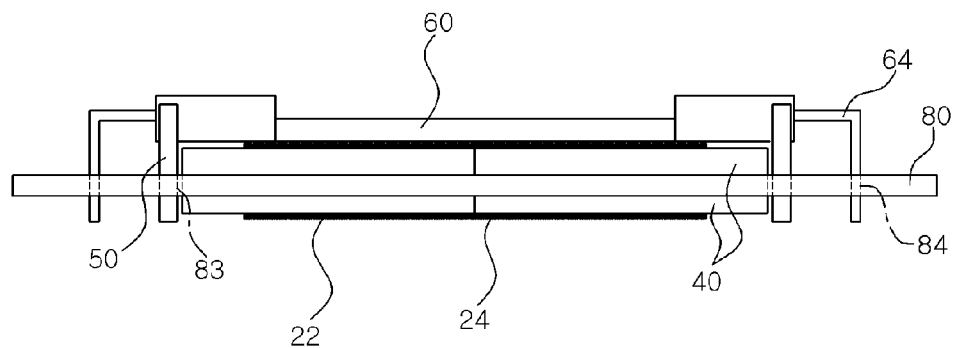
FIG. 6 is a sectional view of the transformer assembly according to the second exemplary embodiment of the present invention.

FIG. 5 is a schematic perspective view of a transformer assembly according to a second exemplary embodiment of the present invention, and FIG. 6 is a sectional view of the transformer assembly according to the second exemplary embodiment of the present invention.

With reference to FIGS. 5 and 6, in the transformer assembly 100 according to the second exemplary embodiment of the present invention, the base plate 60 may include a support pin 50 supporting the space between the base plate 60 and the PCB 80.

The support pin 50 may be fastened to a support pin hole 83 formed on the PCB 80 to complement a fixing force for fixing the lead frame 64 of the transformer 10 on the PCB 80.

Figure 7:
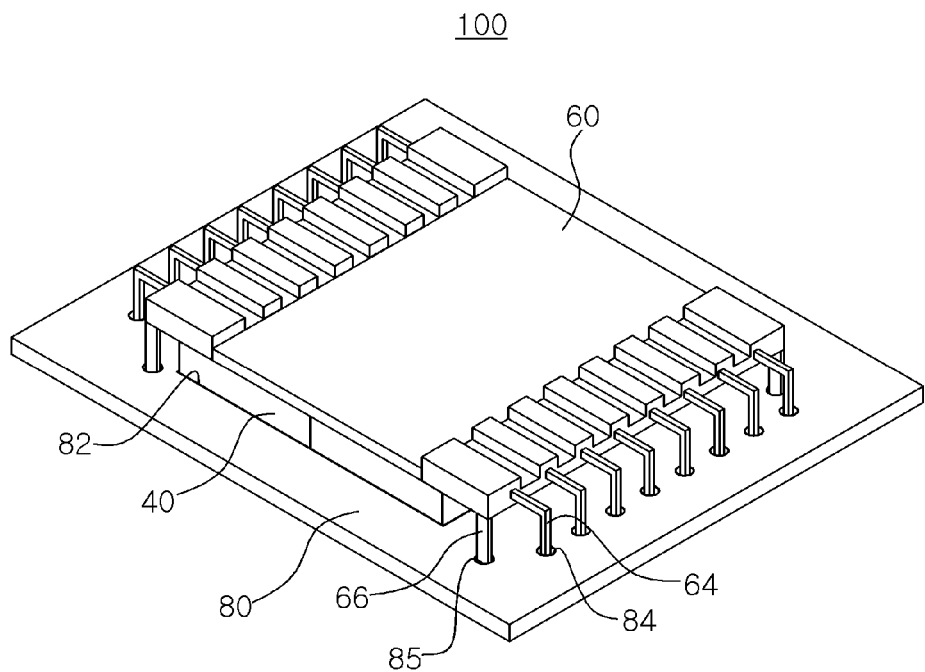
FIG. 7 is a schematic perspective view of a transformer assembly according to a third exemplary embodiment of the present invention.
Figure 8:
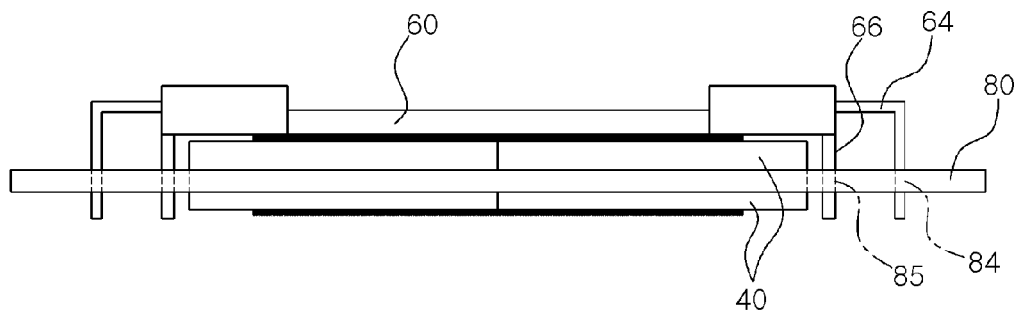
FIG. 8 is a sectional view of the transformer assembly according to the third exemplary embodiment of the present invention.

FIG. 7 is a schematic perspective view of a transformer assembly according to a third exemplary embodiment of the present invention, and FIG. 8 is a sectional view of the transformer assembly according to the third exemplary embodiment of the present invention.

With reference to FIGS. 7 and 8, in the transformer assembly 100 according to the third exemplary embodiment of the present invention, the base plate 60 may include a boss 66 supporting the space between the base plate 60 and the PCB 80.

The boss 66 may be fastened into a boss hole 85 formed in the PCB 80 to complement a fixing force for fixing the lead frame 64 of the transformer 10 to the PCB 80.

As described above, in the transformer and the transformer assembly according to exemplary embodiments of the present invention, because the core is disposed in the core through hole formed on the PCB, the height of the top face of the transformer from the upper surface of the PCB can be reduced.

Also, because the height of the transformer from the upper surface of the PCB is reduced, the flat panel display including the transformer can have a slimmer external appearance when compared with a flat panel display including a transformer disposed in a normal position.

As set forth above, in the transformer and the transformer assembly according to exemplary embodiments of the invention, because the core is disposed within the core through hole formed on the PCB, the top face of the transformer is lowered at the upper surface of the PCB.

In addition, because the height of the transformer is lowered from the upper surface of the PCB, the external appearance of a flat panel display can become thinner when compared with a flat panel display in which a transformer is installed in a normal position on the PCB.

While the present invention has been shown and described in connection with the exemplary embodiments, it will be apparent to those skilled in the art that modifications and variations can be made without departing from the spirit and scope of the invention as defined by the appended claims.

What is claimed is:

1. A transformer, comprising:
   a printed circuit board (PCB) having a through-hole formed therein;
   a bobbin on which a coil is wound;
   a core coupled with the bobbin to provide a magnetic flux and installed in the through-hole in the PCB in a penetrating manner; and
   a base plate electrically connected to the coil and having a lead frame connected to the PCB,
   wherein the lead frame is formed such that the base plate is separated from an upper surface of the PCB; and
   wherein the bobbin and the base plate are mounted on the PCB in a reverse form such that the base plate is spaced apart from the PCB with the bobbin interposed therebetween.

2. The transformer of claim 1, wherein a lower surface of the base plate is separated from the upper surface of the PCB by a space equal to the distance by which the core is exposed from the through hole on the upper surface of the PCB.

3. The transformer of claim 1, further comprising an insulating member which is provided in the space between the PCB and the base plate and is fastened to an insulating member insertion hole formed on the PCB.

4. The transformer of claim 3, wherein the insulating member is an injection-molded product supporting the base plate and installed to be adjacent to the lead frame.

5. The transformer of claim 1, wherein the base plate comprises a support pin fastened to a support pin hole formed on the PCB for maintaining the space between the base plate and the PCB.

6. The transformer of claim 1, wherein the base plate comprises a boss fastened to a boss hole formed on the PCB for maintaining the space between the base plate and the PCB.

7. A transformer assembly, comprising:
   a transformer including a core coupled to a bobbin on which a coil is wound and a base plate supporting the core; and
   a printed circuit board (PCB) having a through hole which the core penetrates, a portion of the core being disposed within the through hole,
   wherein the base plate includes a lead frame allowing the transformer to be mounted in a reverse form such that the base plate is spaced apart from the PCB with the bobbin interposed therebetween.

8. The assembly of claim 7, wherein the lead frame is bent to extend in a direction in which the core is mounted.

9. The assembly of claim 7, further comprising
   an insulating member which is provided in a space between the base plate and the PCB, and
   an insulating member insertion hole which is formed on the PCB for allowing the insulating member to be inserted therein.

10. The assembly of claim 9, wherein the insulating member is an injection-molded product supporting the base plate and installed to be adjacent to the lead frame.

11. The assembly of claim 7, wherein
    the base plate comprises a support pin for maintaining the space between the base plate and the PCB, and
    a support pin hole into which the support pin is to be fastened is formed on the PCB.

12. The assembly of claim 7, wherein
    the base plate comprises a boss for maintaining the space between the base plate and the PCB, and
    a boss hole into which the boss is to be fastened is formed on the PCB.

* * * * *